(12) United States Patent
Lee et al.

(10) Patent No.: US 11,690,276 B2
(45) Date of Patent: Jun. 27, 2023

(54) THIN-FILM DEPOSITION MASK ASSEMBLY AND METHOD OF FABRICATING ORGANIC LIGHT-EMITTING DISPLAY PANEL USING SAME

(71) Applicant: LG Display Co., Ltd., Seoul (KR)

(72) Inventors: Hyun Kyung Lee, Paju-si (KR); Seyong Lee, Paju-si (KR)

(73) Assignee: LG Display Co., Ltd., Seoul (KR)

(*) Notice: Subject to any disclaimer, the term of this patent is extended or adjusted under 35 U.S.C. 154(b) by 277 days.

(21) Appl. No.: 17/129,071

(22) Filed: Dec. 21, 2020

(65) Prior Publication Data

US 2021/0202852 A1 Jul. 1, 2021

(30) Foreign Application Priority Data

Dec. 31, 2019 (KR) .................. 10-2019-0179756

(51) Int. Cl.
*H10K 71/16* (2023.01)
*C23C 14/12* (2006.01)
*C23C 14/04* (2006.01)
*H10K 71/00* (2023.01)

(52) U.S. Cl.
CPC ......... *H10K 71/166* (2023.02); *C23C 14/042* (2013.01); *C23C 14/12* (2013.01); *H10K 71/00* (2023.02)

(58) Field of Classification Search
CPC ... H01L 51/0011; H01L 51/56; C23C 14/042; C23C 14/12
See application file for complete search history.

(56) References Cited

U.S. PATENT DOCUMENTS

| 2014/0065302 | A1 | 3/2014 | Chang |
| 2017/0130320 | A1 | 5/2017 | Kobayashi et al. |
| 2021/0140061 | A1* | 5/2021 | Paik ............... C23C 14/042 |

FOREIGN PATENT DOCUMENTS

| CN | 1592526 | A | 3/2005 |
| CN | 101645492 | A | 2/2010 |
| CN | 102162082 | A | 8/2011 |
| CN | 103852968 | A | 6/2014 |
| CN | 104201192 | A | 12/2014 |
| CN | 105720074 | A | 6/2016 |
| WO | WO 2015198973 | A1 | 12/2015 |

* cited by examiner

*Primary Examiner* — Anne M Hines
(74) *Attorney, Agent, or Firm* — Seed IP Law Group LLP

(57) ABSTRACT

Provided are a thin-film deposition mask assembly and a method of fabricating an organic light-emitting display panel using the same. A first mask includes a plurality of first openings disposed in odd columns and a plurality of second openings disposed in even columns. A single second opening disposed in an nth even column, among the plurality of second openings, is disposed between two first openings arranged in a first direction corresponding to row direction transverse to column direction and disposed in at least one column of (n−1)th and (n+1)th columns, among the plurality of first openings, where n is a natural number equal to or greater than 2. In some embodiments, the row direction and the column direction may be perpendicular to each other. The first mask is prevented from sagging.

18 Claims, 8 Drawing Sheets

FIG.1
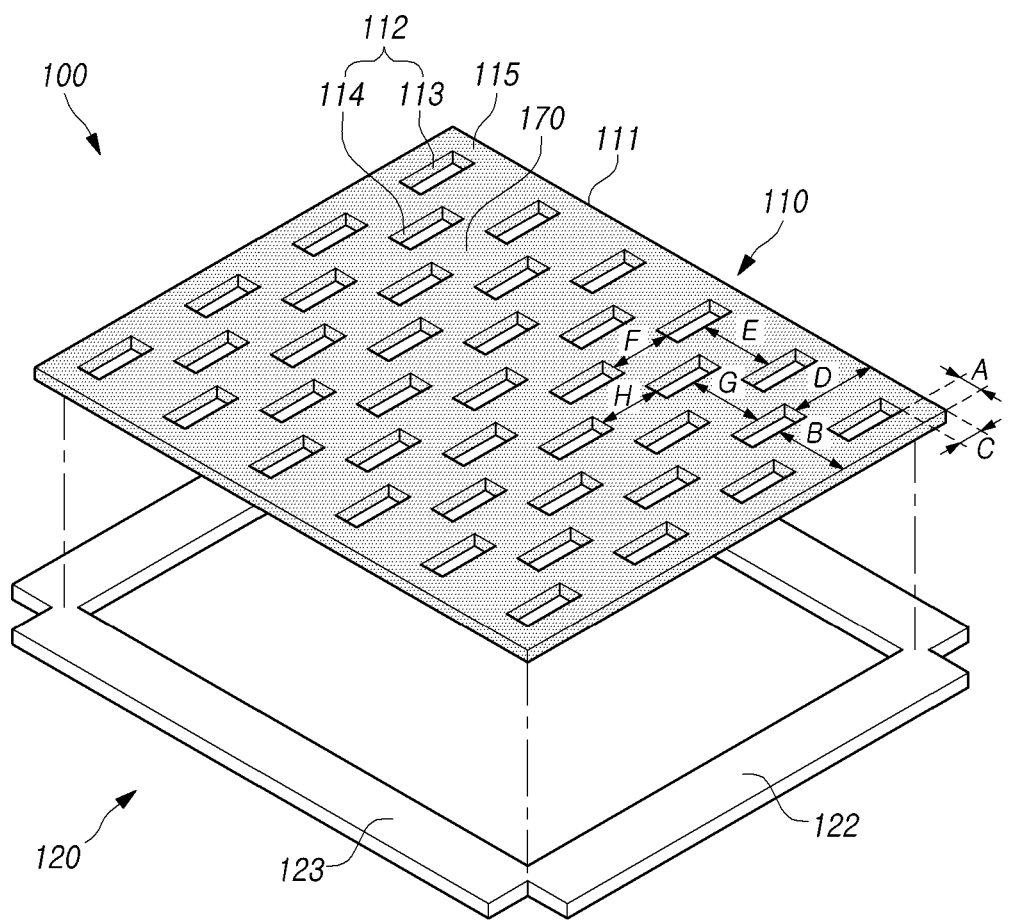
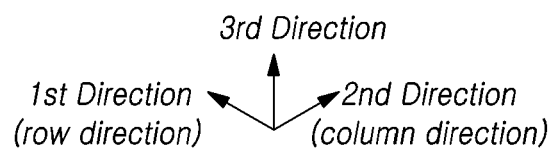

THIN-FILM DEPOSITION MASK ASSEMBLY AND METHOD OF FABRICATING ORGANIC LIGHT-EMITTING DISPLAY PANEL USING SAME

CROSS REFERENCE TO RELATED APPLICATION

This application claims priority from Korean Patent Application No. 10-2019-0179756, filed on Dec. 31, 2019, which is hereby incorporated by reference for all purposes as if fully set forth herein.

BACKGROUND

Technical Field

Embodiments relate to a thin-film deposition mask assembly and a method of fabricating an organic light-emitting display panel using the same and, more particularly, to a thin-film deposition mask assembly able to facilitate the deposition of organic layers provided in a high-definition, small-sized organic light-emitting display panel and a method of fabricating an organic light-emitting display panel using the same.

Description of the Related Art

In general, an organic material deposition device is a device for fabricating a film of an organic material on a substrate by applying current to the organic material to be deposited in a vacuum state. The organic material deposition device uses a mask to form an intended shape of an organic film on a substrate. When depositing an organic material on a large substrate having a predetermined or larger area, a metal mask having a high level of durability and strength may be used to reliably deposit the organic material in an intended pattern.

A fine metal mask (FMM) is a mask used to deposit a fine pattern of an organic material on a large substrate.

The use of the fine metal mask allows a plurality of intended fine patterns of an organic material to be fabricated on predetermined locations of a substrate in a single operation. The fine metal mask may have a plurality of rectangular slots or striped slits, through which an organic material passes, to deposit the organic material in an intended pattern.

BRIEF SUMMARY

In a high definition organic light-emitting display panel, the size of an emission area is reduced, such that the size of a plurality of rectangular slots provided in a fine metal mask must be reduced. However, a process of forming fine slots corresponding to the size of emission areas of the high definition organic light-emitting display panel may be difficult, which is problematic.

In addition, a fine metal mask having a plurality of slits may include a rib provided between the plurality of slits. In a case in which the plurality of slits of the fine metal mask extend in a predetermined direction, the area of the rib provided between the plurality of slits may be reduced, such that the mask may sag.

The fine metal mask having the plurality of slits may obtain a higher aperture ratio than the fine metal mask having the plurality of slots. However, when a portion of the rib, adjacent to an outermost slit of the mask, sags in an organic layer deposition device, a slit area adjacent to the outermost slit of the mask may not be properly masked during organic layer deposition, thereby causing a defect in the organic layer deposition.

In this regard, the inventors of the present disclosure have invented a novel structure of a thin-film deposition mask frame able to overcome the above-described problems and a novel method of fabricating an organic light-emitting display panel using the same.

One or more embodiments of the present disclosure provides a thin-film deposition mask assembly having a structure able to prevent a mask from sagging in the deposition of an organic layer of an organic light-emitting device, such as organic light-emitting diode (OLED), and a method of fabricating an organic light-emitting display panel using the same.

One or more embodiments of the present disclosure provides a thin-film deposition mask assembly having a structure able to fabricate an organic layer of an OLED even in the case in which an organic light-emitting display panel has a relatively-small emission area, and a method of fabricating an organic light-emitting display panel using the same.

The technical benefits of the present disclosure is not limited to the aforementioned description, and other benefits not explicitly disclosed herein will be clearly understood by those having ordinary knowledge in the technical field, to which the present disclosure pertains, from the description provided hereinafter.

According to an embodiment, provided is a thin-film deposition mask assembly having a structure able to prevent a mask from sagging and to deposit of organic layers of OLEDs used in a high-definition organic light-emitting display panel. The thin-film deposition mask assembly includes: a first mask including a first base member and a plurality of openings provided in the first base member and spaced apart from each other; and a first frame holding the first mask. The plurality of openings of the first mask may include a plurality of first openings disposed in odd columns and a plurality of second openings disposed in even columns. A single second opening disposed in an nth even column, among the plurality of second openings, may be disposed between two first openings arranged in a first direction and disposed in at least one column of $(n-1)$th and $(n+1)$th columns, among the plurality of first openings, where n is a natural number equal to or greater than 2.

According to another embodiment, provided is a thin-film deposition mask assembly having a structure able to prevent a mask from sagging and to deposit of organic layers of OLEDs used in a high-definition organic light-emitting display panel. The thin-film deposition mask assembly may include: a second mask including a second base member and a plurality of openings provided in the second base member and spaced apart from each other; and a second frame holding the second mask. The plurality of openings of the second mask may include a plurality of third openings disposed in odd columns and a plurality of fourth openings disposed in even columns. A single third opening disposed in an mth odd column, among the plurality of third openings, may be disposed between two fourth openings arranged in a first direction and disposed in an $(m+1)$th column, among the plurality of fourth openings, where m is a natural number equal to or greater than 1.

Provided is a method of fabricating an organic light-emitting display panel using the thin-film deposition mask assembly according to an embodiment, so that a mask may be prevented from sagging and organic layers of OLEDs used in a high-definition organic light-emitting display panel may be deposited. The organic light-emitting display panel may include a plurality of OLEDs respectively including a first electrode disposed on a substrate, a second electrode disposed on the substrate to oppose the first electrode, and an organic layer disposed between the first electrode and the second electrode. The organic layer may be fabricated using the thin-film deposition mask assembly including the first mask having first and second openings.

According to embodiments, the thin-film deposition mask assembly including a plurality of first openings disposed in odd columns and a plurality of second openings disposed in even columns or a plurality of third openings disposed in odd columns and a plurality of fourth openings disposed in even columns may be provided. The aperture ratio of each of the openings of the mask may be obtained. An organic layer disposed in the organic light-emitting display panel having fine emission areas may be deposited without a defect.

According to embodiments, the provision of the thin-film deposition mask assembly including a plurality of first openings disposed in odd columns and a plurality of second openings disposed in even columns or a plurality of third openings disposed in odd columns and a plurality of fourth openings disposed in even columns may prevent the mask from sagging during deposition of an organic layer of an OLED.

BRIEF DESCRIPTION OF THE SEVERAL VIEWS OF THE DRAWINGS

The above and other features, and advantages of the present disclosure will be more clearly understood from the following detailed description, taken in conjunction with the accompanying drawings, in which:

FIG. 1 is an exploded perspective view illustrating a thin-film deposition mask assembly according to an embodiment;

DETAILED DESCRIPTION

Figure 2:
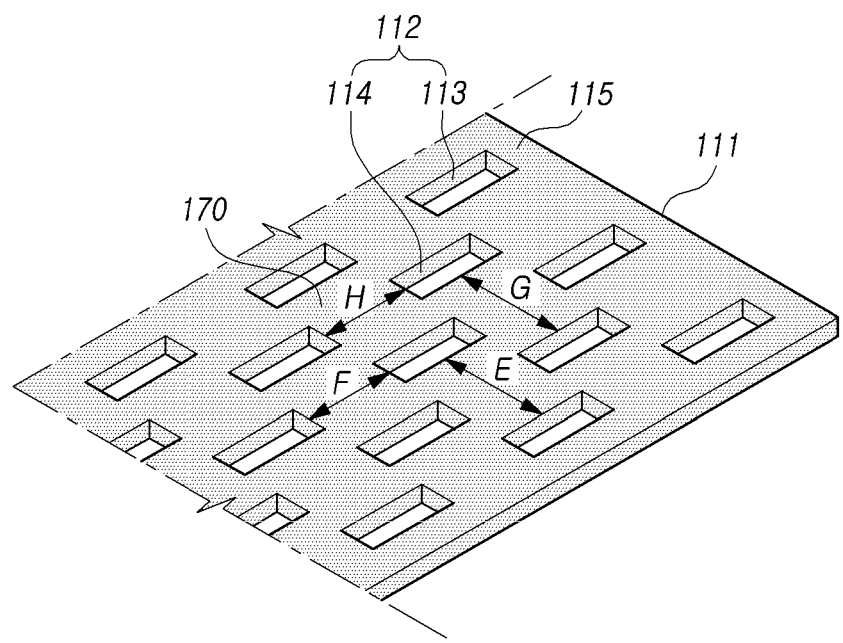
FIG. 2 is an enlarged view of a portion of the mask illustrated in FIG. 1.

The advantages and features of the present disclosure and methods of the realization thereof will be apparent with reference to the accompanying drawings and detailed descriptions of the embodiments. The present disclosure should not be construed as being limited to the embodiments set forth herein and may be embodied in a variety of different forms. Rather, these embodiments are provided so that the present disclosure will be thorough and complete, and will fully convey the scope of the present disclosure to those having ordinary knowledge in the technical field.

The shapes, sizes, ratios, angles, numbers, and the like, inscribed in the drawings to illustrate embodiments are illustrative only, and the present disclosure is not limited to the embodiments illustrated in the drawings. Throughout this document, the same reference numerals and symbols will be used to designate the same or like components. In the following description of the present disclosure, detailed descriptions of known functions and components incorporated into the present disclosure will be omitted in the situation in which the subject matter of the present disclosure may be rendered unclear thereby. It will be understood that the terms "comprise," "include," "have," and any variations thereof used herein are intended to cover non-exclusive inclusions unless explicitly described to the contrary. Descriptions of components in the singular form used herein are intended to include descriptions of components in the plural form, unless explicitly described to the contrary.

In the analysis of a component, it shall be understood that an error range is included therein, even in the situation in which there is no explicit description thereof.

When spatially relative terms, such as "on," "above," "under," "below," and "on a side of," are used herein for descriptions of relationships between one element or component and another element or component, one or more intervening elements or components may be present between the one and other elements or components, unless a term, such as "immediately" or "directly," is used.

When temporally relative terms, such as "after," "subsequent," "following," and "before" are used to define a temporal relationship, a non-continuous case may be included unless the term "immediately" or "directly" is used.

In addition, terms, such as "first" and "second" may be used herein to describe a variety of components. It should be understood, however, that these components are not limited by these terms. These terms are merely used to discriminate one element or component from other elements or components. Thus, a first component referred to as first hereinafter may be a second component within the spirit of the present disclosure.

The features of one or more embodiments of the present disclosure may be partially or entirely coupled or combined with each other and may work in concert with each other or may operate in a variety of technical methods. In addition, respective embodiments may be carried out independently or may be associated with and carried out in concert with other embodiments.

Hereinafter, a thin-film deposition mask assembly including a plurality of first openings disposed in odd columns and a plurality of second openings disposed in even columns or including a plurality of third openings disposed in odd columns and a plurality of fourth openings disposed in even columns and a method of fabricating an organic light-emitting display panel will be described.

A thin-film deposition mask according to an embodiment may include: a first mask including a first base member and a plurality of openings provided in the first base member and spaced apart from each other; and a first frame holding the first mask. The plurality of openings of the first mask may include a plurality of first openings disposed in odd columns and a plurality of second openings disposed in even columns. A single second opening disposed in an nth even column, among the plurality of second openings, may be disposed between two first openings arranged in a first direction corresponding to row direction perpendicular to column direction and disposed in at least one column of (n−1)th and (n+1)th columns, among the plurality of first openings, where n is a natural number equal to or greater than 2.

The single second opening disposed in the nth even column may be disposed between two first openings arranged in a second direction overlapping the first direction, among the plurality of second openings. One of the two first openings may be disposed in the (n−1)th column, and the other of the two first openings may be disposed in the (n+1)th column.

A distance in the first direction from an outermost first opening among the plurality of first openings arranged in the first direction to an edge of the first mask may be smaller than a distance in the first direction from an outermost second opening among the plurality of second openings arranged in the first direction to the edge of the first mask.

A distance in the second direction from an outermost first opening among the plurality of first openings arranged in the second direction to an edge of the first mask may be smaller than a distance in the second direction from an outermost second opening among the plurality of second openings arranged in the second direction to the edge of the first mask.

The plurality of first openings and the plurality of second openings may have corresponding shapes.

A first distance between adjacent first openings of the plurality of first openings in the first direction may be substantially the same as a second distance between adjacent second openings of the plurality of second openings in the first direction. A third distance between adjacent first openings of the plurality of first openings in a second direction overlapping the first direction may be substantially the same as a fourth distance between adjacent second openings of the plurality of second openings in the second direction.

Each of the first distance and the second distance may be greater than each of the third distance and the fourth distance.

Each of the first distance and the second distance may be greater than the length of a longer side of each of the plurality of first openings and the plurality of second openings. Each of the third distance and the fourth distance may be equal to or greater than the length of the longer side of each of the plurality of first openings and the plurality of second openings.

A thin-film deposition mask assembly according to another embodiment may include: a second mask including a second base member and a plurality of openings provided in the second base member and spaced apart from each other; and a second frame holding the second mask. The plurality of openings of the second mask may include a plurality of third openings disposed in odd columns and a plurality of fourth openings disposed in even columns. A single third opening disposed in an mth odd column, among the plurality of third openings, may be disposed between two fourth openings arranged in a first direction and disposed in an (m+1)th column, among the plurality of fourth openings, where m is a natural number equal to or greater than 1.

The single third opening disposed in the (m+2)th odd column may be disposed between two fourth openings arranged in a second direction overlapping the first direction, among the plurality of fourth openings. One of the two fourth openings may be disposed in the (m+1)th column, and the other of the two fourth openings may be disposed in the (m+3)th column.

A distance in the first direction from an outermost third opening among the plurality of third openings arranged in the first direction to an edge of the second mask may be smaller than a distance in the first direction from an outermost fourth opening among the plurality of fourth openings arranged in the first direction to the edge of the second mask.

A distance in the second direction from an outermost third opening among the plurality of third openings arranged in the second direction to the edge of the second mask may be greater than a distance in the second direction from an outermost fourth opening among the plurality of fourth openings arranged in the second direction to the edge of the second mask.

The plurality of third openings and the plurality of fourth openings may have corresponding shapes.

A fifth distance between adjacent third openings of the plurality of third openings in the first direction may be substantially the same as a sixth distance between adjacent fourth openings of the plurality of fourth openings in the first direction. A seventh distance between adjacent third openings of the plurality of third openings in a second direction overlapping the first direction may be substantially the same as an eighth distance between adjacent fourth openings of the plurality of fourth openings in the second direction.

Each of the fifth distance and the sixth distance may be greater than each of the seventh distance and the eighth distance.

Each of the fifth distance and the sixth distance may be greater than the length of a longer side of each of the plurality of third openings and the plurality of fourth openings. Each of the seventh distance and the eighth distance may be equal to or greater than the length of the longer side of each of the plurality of third openings and the plurality of fourth openings.

Provided is a method of fabricating an organic light-emitting display panel including a plurality of organic light-emitting devices respectively including a first electrode disposed on a substrate, a second electrode disposed on the substrate to oppose the first electrode, and an organic layer disposed between the first electrode and the second electrode. The organic layer may be fabricated using a thin-film deposition mask assembly according to an embodiment, including a first mask having a plurality of first openings disposed in odd columns and a plurality of second openings disposed in even columns. A single second opening disposed in an nth even column, among the plurality of second openings, is disposed between two first openings arranged in a first direction and disposed in at least one column of (n−1)th and (n+1)th columns, among the plurality of first openings, where n is a natural number equal to or greater than 2.

In a case in which the organic light-emitting display panel includes a plurality of first emission areas, a plurality of second emission areas, and a plurality of third emission areas spaced apart from each other, the method may include: disposing the thin-film deposition mask assembly such that the plurality of first openings disposed in the odd columns of the thin-film deposition mask assembly are disposed to correspond to odd-numbered first emission areas among the plurality of first emission areas arranged in the first direction and the plurality of second openings disposed in the even columns of the thin-film deposition mask assembly are disposed to correspond to even-numbered first emission areas among the plurality of first emission areas arranged in the first direction; and supplying an organic layer material to one surface of the thin-film deposition mask assembly having the plurality of first openings and the plurality of second openings.

The method may further include: shifting the thin-film deposition mask assembly having the plurality of first openings and the plurality of second openings from one side of a first emission area disposed in a single column, among the plurality of first emission areas, to one side of a first emission area disposed in another column, among the plurality of first emission areas; disposing the thin-film deposition mask assembly such that the plurality of first openings disposed in the even columns of the thin-film deposition mask assembly are disposed to correspond to even-numbered first emission areas among the plurality of first emission areas arranged in the first direction and the plurality of second openings disposed in the odd columns of the thin-film deposition mask assembly are disposed to correspond to odd-numbered first emission areas among the plurality of first emission areas arranged in the first direction; and supplying the organic layer material to the surface of the thin-film deposition mask assembly having the plurality of first openings and the plurality of second openings.

The method may further include: disposing the thin-film deposition mask assembly such that the plurality of third openings disposed in the odd columns of the thin-film deposition mask assembly are disposed to correspond to even-numbered first emission areas among the plurality of first emission areas arranged in the first direction and the plurality of fourth openings disposed in the even columns of the thin-film deposition mask assembly are disposed to correspond to odd-numbered first emission areas among the plurality of first emission areas arranged in the first direction; and supplying the organic layer material to one surface of the thin-film deposition mask assembly having the plurality of third openings and the plurality of fourth openings.

Hereinafter, embodiments of the present disclosure will be described in detail with reference to the accompanying drawings.

FIG. 1 is an exploded perspective view illustrating a thin-film deposition mask assembly according to an embodiment, and FIG. 2 is an enlarged view of a portion of the mask illustrated in FIG. 1.

Referring to FIGS. 1 and 2, a first thin-film deposition mask assembly 100 according to an embodiment may include a first mask 110 and a frame 120.

The frame 120 may be implemented as a member having a degree of strength sufficient to support the first mask 110. The frame 120 may have a pair of first sides 122 parallel to each other and a pair of second sides 123 connecting both ends of the pair of first sides 122.

The first mask 110 includes a first base member 111 and a plurality of openings 112 provided in the first base member 111.

The composition of the first base member 111 may include Ni, a Ni Ally, a Ni—Co alloy, and the like. Accordingly, this may facilitate the formation of a fine pattern (e.g., a plurality of openings) in the first base member 111. However, the material of the first base member 111 according to embodiments is not limited thereto, and any material may be used as long as a fine pattern may be easily formed in the first base member 111.

Adjacent openings 112 among the plurality of openings 112 may be divided by a first rib 170.

The first mask 110 may include a first rib support 115 at least partially surrounding an area in which the plurality of openings 112 and the first rib 170 are disposed. The first rib support 115 and the first rib 170 may be integrally provided.

In some embodiments, the entirety or a portion of the area of the first rib support 115 of the first mask 110 may be in contact with the top surface of the frame 120. However, embodiments are not limited thereto, and the first mask 110 may be seated on the frame 120 such that side surfaces of the first mask 110 are in contact with inner portions of the frame 120, respectively.

The plurality of openings 112 of the first mask 110 may include a plurality of first openings 113 and a plurality of second openings 114. The plurality of first openings 113 may be disposed in odd columns (or odd rows), whereas the plurality of second openings 114 may be disposed in even columns (or even rows).

However, embodiments are not limited thereto, and the plurality of first openings 113 may be disposed in even columns, whereas the plurality of second openings 114 may be disposed in odd columns. In the following description, for the sake of brevity, an arrangement in which the first openings 113 are disposed in odd columns and the second openings 114 are disposed in even columns will mainly be described.

The first mask 110 according to embodiments may have a structure in which the plurality of first openings 113 are disposed in one or more odd columns and the plurality of second openings 114 are disposed in one or more even columns.

Here, a single opening 112 may be a component through which an organic layer of a single organic light-emitting device, such as a single organic light-emitting diode (OLED), may be deposited. The plurality of first openings 113 and the plurality of second openings 114 may be used to fabricate organic layers generating light having substantially the same color. That is, the plurality of first openings 113 and the plurality of second openings 114 may respectively be used to form organic layers in different positions, and OLEDs including the organic layers deposited through the first and second openings 113 and 114 may emit light having substantially the same color.

The plurality of first openings 113 disposed in respective odd columns may be spaced apart from each other in a first direction. Here, in first openings 113 disposed in a single row among the plurality of first openings 113, a first opening 113 may be spaced apart from an adjacent first opening 113 by a first distance E. That is, the first openings 113 disposed in the single row may be spaced apart from each other by substantially the same first distance E.

In addition, the first rib 170 may be disposed in the first direction, between first openings 113 disposed in a single row among the plurality of first openings 113.

The plurality of first openings 113 disposed in respective odd rows may be spaced apart from each other in the second direction overlapping the first direction. Here, in first openings 113 disposed in a single column among the plurality of first openings 113, adjacent first openings 113 may be spaced apart from each other by a second distance F. That is, first openings 113 disposed in an odd row and first openings 113 disposed in an adjacent odd row, among the plurality of first openings 113, may be equally spaced apart by substantially the same second distance F.

The first distance E may indicate a minimum distance between adjacent first openings 113 disposed in a single row, among the plurality of first openings 113, in the first direction.

The second distance F may indicate a minimum distance between adjacent first openings 113 disposed in a single column among the plurality of first openings 113, in the second direction.

In addition, the first rib 170 may be disposed between adjacent odd columns of first openings 113 among the plurality of first openings 113.

The first rib 170 disposed between the first openings 113 may be provided integrally with the first rib support 115.

Since the first rib 170 disposed between the first openings 113 is provided integrally with the first rib support 115, deformation, such as sagging, occurring in the first mask 110 having the plurality of first openings 113 may be prevented.

The plurality of second openings 114 in respective even columns may also be spaced apart from each other in the first direction. In second openings 114 disposed in a single row among the plurality of second openings 114, a second opening 114 may be spaced apart from an adjacent second opening 114 by a third distance G. That is, the second openings 114 disposed in the single row may be spaced apart from each other by the same third distance G.

In addition, the first rib 170 may be disposed in the first direction, between second openings 114 disposed in a single column among the plurality of second openings 114.

The plurality of second openings 114 disposed in respective even rows may be spaced apart from each other in the second direction overlapping the first direction. Here, among second openings 114 disposed in a single column among the plurality of second openings 114, adjacent second openings 114 may be spaced apart from each other by a fourth distance H. That is, second openings 114 disposed in an even column, among the plurality of second openings 114, may be equally spaced apart by the same fourth distance H.

The third distance G may indicate a minimum distance between adjacent second openings 114 disposed in a single row, among the plurality of second openings 114, in the first direction. The fourth distance H may indicate a minimum distance between adjacent second openings 114 disposed in a single column, among the plurality of second openings 114, in the second direction.

Here, the first distance E and the third distance G may be the same. The second distance F and the fourth distance H may be the same. The first and third distances E and G may be greater than the second distance F and the fourth distance H.

The first distance E and the third distance G may range from 50 μm to 150 μm and the second distance F and the fourth distance H may range from 10 μm to 100 μm, but the distances according to embodiments are not limited thereto. For example, the first distance E and the third distance G may be 100 μm or more and less than 150 μm and the second distance F and the fourth distance H may be 10 μm or more and less than 100 μm.

In addition, the first rib 170 may be disposed between adjacent even columns of second openings 114 among the plurality of second openings 114.

The first rib 170 disposed between the first openings 113 and the first rib 170 disposed between the second opening 114 may be provided as an integral component. Due to the first rib 170 being disposed between the openings as described, deformation, such as sagging, in the first mask 110 having the plurality of openings 112 may be prevented.

Here, a second opening 114 disposed in an even column (e.g., the nth even column (where n is a natural number equal to or greater than 2)) may be disposed between two first openings 113 arranged in the first direction while being disposed in at least one column of the (n−1)th column and the (n+1)th column.

In addition, a second opening 114 disposed in an even column (e.g., an nth even column (where n is a natural number equal to or greater than 2)) may be disposed between a first opening 113 disposed in the (n−1)th column and a first opening 113 disposed in the (n+1)th column, the first openings 113 being arranged in the second direction.

Here, a distance A in the first direction from outermost first openings 113 among the plurality of first openings 113 arranged in the first direction to the edge of the first mask 110 may be smaller than a distance B in the first direction from outermost second openings 114 of the plurality of second openings 114 arranged in the first direction to the edge of the first mask 110.

In addition, a distance C in the second direction from outermost first openings 113 of the plurality of first openings 113 arranged in the second direction to the edge of the first mask 110 may be smaller than a distance D in the second direction from outermost second openings 114 of the plurality of second openings 114 arranged in the second direction to the edge of the first mask 110.

Each of the first and second openings 113 and 114 may have the shape of a rectangle, with the sides thereof in the second direction being longer than the sides thereof in the first direction. Since the plurality of first openings 113 and the plurality of second openings 114 are used to fabricate organic layers generating light having substantially the same color, the first and second openings 113 and 114 may have substantially the same shape. However, the shape of the first and second openings 113 and 114 is not limited to the rectangular shape illustrated in FIGS. 1 and 2, and may have a variety of shapes, such as a circular shape or a polygonal shape.

The first thin-film deposition mask assembly 100 according to the present embodiment may be used in a variety of thin-film deposition processes, and in particular, in a process of patterning organic layers of OLEDs.

Figure 3:
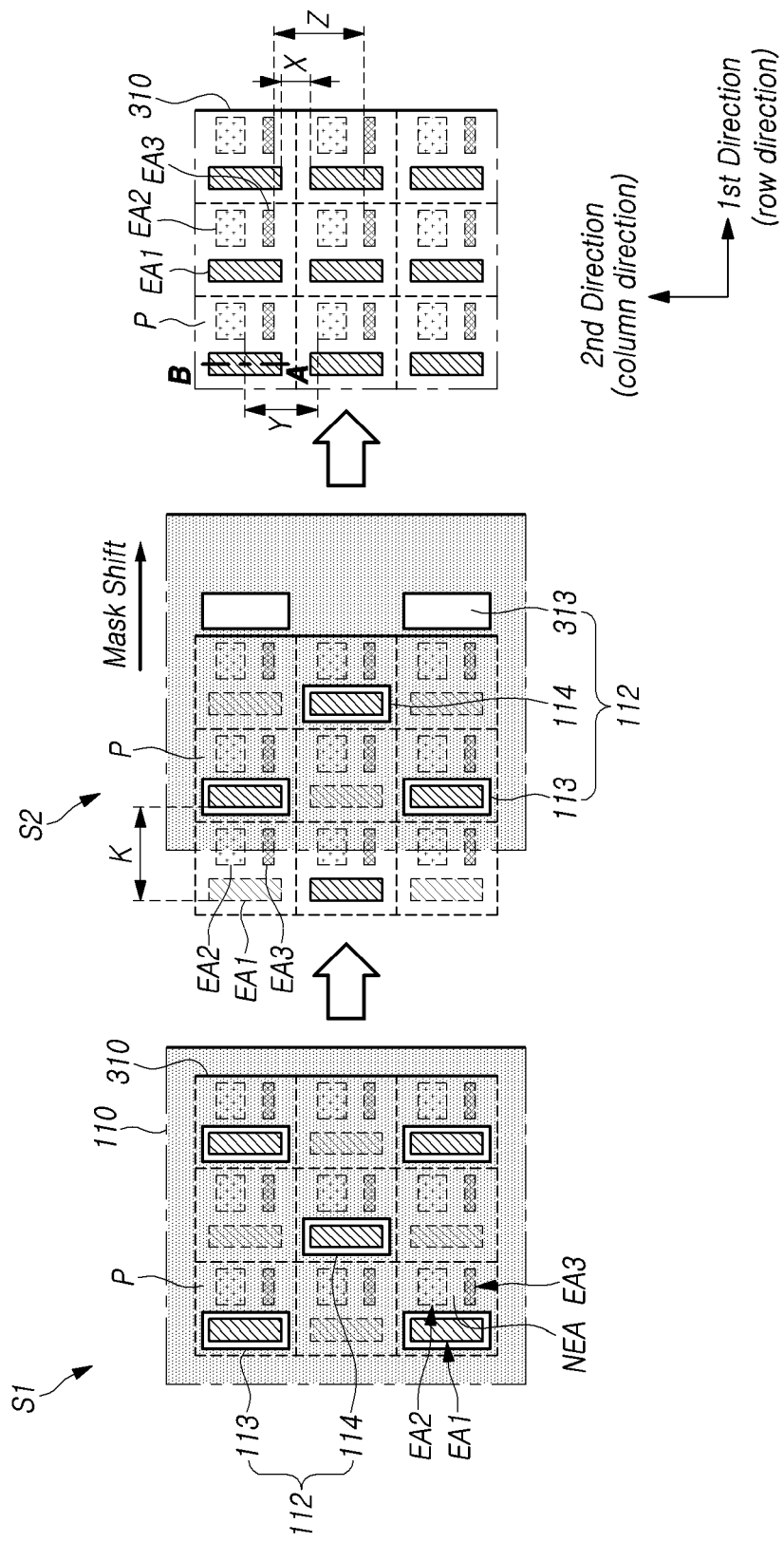
FIG. 3 is a schematic view illustrating some operations of a process of fabricating organic layers of OLEDs disposed in an area corresponding to an emission area in each of pixel areas of an organic light-emitting display panel.
Figure 4:
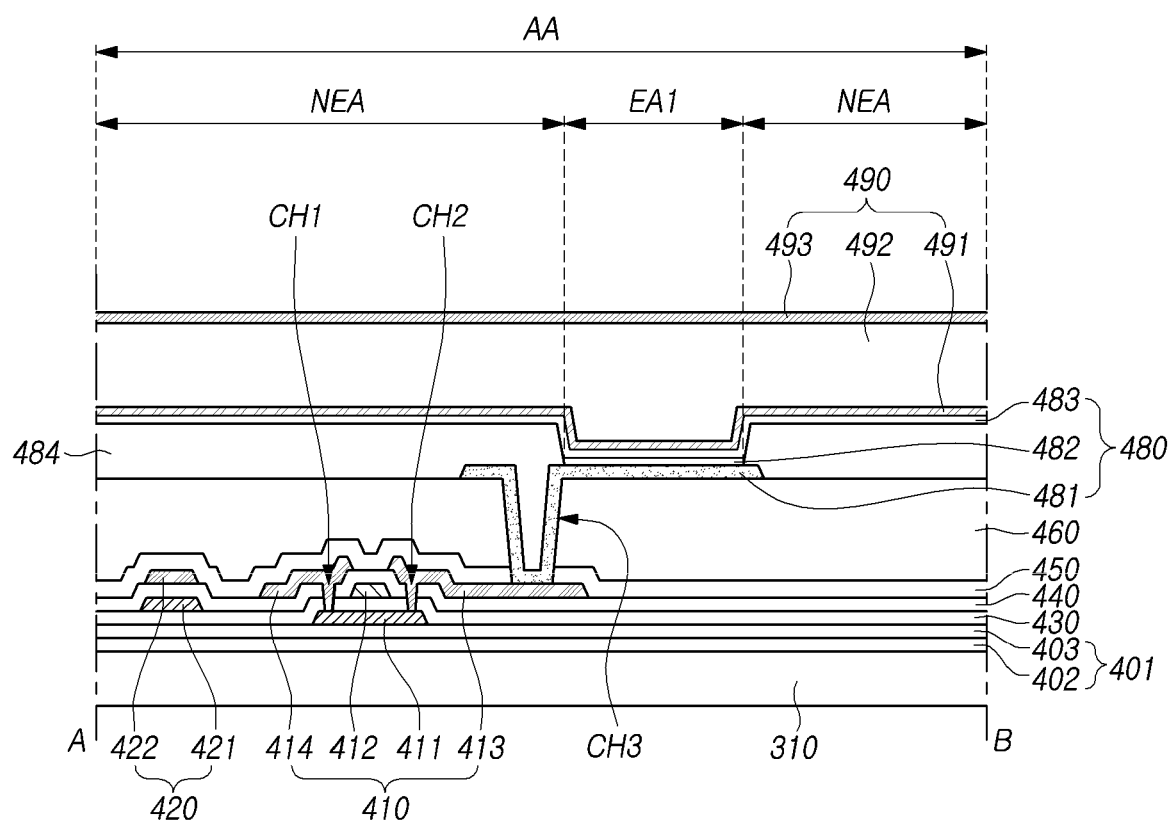
FIG. 4 is a cross-sectional view illustrating a portion of a single subpixel area of an organic light-emitting display panel according to an embodiment.

FIG. 3 is a schematic view illustrating some operations of a process of fabricating organic layers of OLEDs disposed in an area corresponding to an emission area in each of pixel areas of an organic light-emitting display panel, and FIG. 4 is a cross-sectional view illustrating a portion of a single subpixel area of an organic light-emitting display panel according to an embodiment.

Referring to FIG. 3, an organic layer 482 of an OLED disposed in at least one emission area among a plurality of emission areas EA1, EA2, and EA3 of an organic light-emitting display panel may be deposited using the first thin-film deposition mask assembly 100 illustrated in FIGS. 1 and 2.

The organic light-emitting display panel may include an active area including a plurality of pixels P and a non-active area.

Each of the plurality of pixels P may include two or more subpixels. Each of the subpixels may include at least one emission area and a circuit area.

For example, as illustrated in FIG. 3, a single pixel P may include three subpixels, with three emission areas EA1, EA2, and EA3 being provided in the single pixel P. However, this is merely an example, and as described above, a configuration in which a single pixel includes two or more subpixels, each of which includes one or more emission areas, may be appropriate.

Hereinafter, for the sake of brevity, a structure in which a single pixel P includes three subpixels, with three emission areas EA1, EA2, and EA3 being provided in the single pixel P, will mainly be described.

As described above, a single pixel P may include a first emission area EA1, a second emission area EA2, and a third emission area EA3.

Here, the first emission area EA1 may be a blue light emission area, second emission area EA2 may be a green light emission area, and a third emission area EA3 may be a red light emission area. However, the colors of light emitted from the first to third emission areas EA1 to EA3 are not limited thereto.

In some embodiments, a single emission area may be surrounded by a non-emission area. The emission areas and the non-emission area may be divided by banks disposed on a substrate 310.

This will be described as follows with reference to FIG. 4.

Referring to FIG. 4, the active area AA of the organic light-emitting display panel of an organic light-emitting display device according to an embodiment may include a plurality of emission areas EA and a non-emission area adjacent to the emission areas EA.

In the active area AA of the organic light-emitting display panel, at least one transistor 410, at least one storage capacitor 420, and at least one OLED 480 may be disposed on the substrate 310.

The transistor 410 may include an active layer 411, a gate electrode 412, a source electrode 413, and a drain electrode 414.

The storage capacitor 420 may include a first storage capacitor electrode 421 and a second storage capacitor electrode 422.

The OLED 480 may include a first electrode 481, an organic layer 482, and a second electrode 483.

Specifically, a buffer layer 401 may be disposed on the substrate 310. The buffer layer 401 may include a first buffer layer 402 disposed on the substrate 310 and a second buffer layer 403 disposed on the first buffer layer 402.

The composition of the first buffer layer 402 and the composition of the second buffer layer 403 may be different materials. For example, the first and second buffer layers 402 and 403 may have a structure in which at least two inorganic insulating material layers are disposed in an alternating manner, in which each of the inorganic insulating material layers is comprised of silicon oxide (SiOx), silicon nitride (SiNx), silicon oxynitride (SiON), or combinations thereof. However, the buffer layer 401 according to embodiments is not limited thereto.

In some cases, the buffer layer 401 may be omitted or may have a single-layer configuration or a multilayer structure comprised of three or more layers.

The active layer 411 may be disposed on the substrate 310. Although the composition of the active layer 411 may include a silicon-based semiconductor material or an oxide-based semiconductor material, embodiments are not limited thereto.

Although not shown in the drawings, a light blocking layer may be further disposed below the active layer 411 to block external light incident to the active layer 411.

A gate insulating film 430 may be disposed on the active layer 411.

The composition of the gate insulating film 430 may include an inorganic insulating material. For example, the composition of the gate insulating film 430 may include an inorganic material, such as SiOx, SiNx, or SiON, but embodiments are not limited thereto.

The gate electrode 412 may be disposed on the gate insulating film 430.

Although the composition of the gate electrode 412 may include at least one of Al, Ag, Au, Cu, W, Mo, Cr, Ni, Nd, Ta, Ti, or alloys thereof, embodiments are not limited thereto. Any configuration in which the composition of the gate electrode 412 includes a conductive material may be used.

In addition, although the gate electrode 412 is illustrated as having a single-layer structure in FIG. 4, embodiments are not limited thereto. For example, the gate electrode 412 may have a multilayer structure comprised of two or more layers.

The first storage capacitor electrode 421 of the storage capacitor 420 may be disposed on the same layer as the gate electrode 412. That is, the first storage capacitor electrode 421 may be disposed on the gate insulating film 430.

Although the composition of the first storage capacitor electrode 421 may include the same material as the gate electrode 412, embodiments are not limited thereto.

An interlayer insulating film 440 may be disposed on the gate electrode 412. Although the composition of the interlayer insulating film 440 may include an inorganic material, such as SiOx, SiNx, or SiON, embodiments are not limited thereto.

The source electrode 413 and the drain electrode 414 may be disposed on the interlayer insulating film 440. The source electrode 413 and the drain electrode 414 may be electrically connected to the active layer 411 through first and second contact holes CH1 and CH2 provided in the gate insulating film 430 and the interlayer insulating film 440.

The composition of each of the source electrode 413 and drain electrode 414 may include at least one of Al, Ag, Au, Cu, W, Mo, Cr, Ni, Nd, Ta, Ti, or alloys thereof, but embodiments are not limited thereto. Any configuration in which the composition of each of the source electrode 413 and drain electrode 414 includes a conductive material may be used.

Although each of the source electrode 413 and drain electrode 414 is illustrated as having a single-layer structure in FIG. 4, embodiments are not limited thereto. For example, each of the source electrode 413 and drain electrode 414 may have a multilayer structure comprised of two or more layers.

In FIG. 4, although the reference numeral 413 is the source electrode and the reference numeral 414 is the drain electrode in the structure illustrated in FIG. 4, embodiments are not limited thereto. The reference numeral 413 may refer to the drain electrode, while the reference numeral 414 may refer to the source electrode.

The second storage capacitor electrode 422 of the storage capacitor 420 may be disposed on the same layer as the source electrode 413 and the drain electrode 414. That is, the second storage capacitor electrode 422 may be disposed on the interlayer insulating film 440.

Although the composition of each of the second storage capacitor electrode 422 may include the same material as the source electrode 413 and the drain electrode 414, embodiments are not limited thereto.

A passivation layer 450 may be disposed on the source electrode 413, the drain electrode 414, and the second storage capacitor electrode 422. Although the composition of the passivation layer 450 may include an inorganic material, such as SiOx, SiNx, or SiON, embodiments are not limited thereto.

A planarization layer 460 may be disposed on the passivation layer 450. The composition of the planarization layer 460 may include an organic insulating material. For example, the composition of the planarization layer 460 may include acryl resin, epoxy resin, phenolic resin, polyamide resin, polyimide resin, or the like, but embodiments are not limited thereto.

The OLED 480 and a bank 484 may be disposed on the planarization layer 460.

The OLED 480 may include the first electrode 481, the organic layer 482, and the second electrode 483. Here, the first electrode 481 may be an anode, while the second electrode 483 may be a cathode. The organic layer 482 may include at least one emissive layer.

The first electrode 481 of the OLED 480 may be disposed on the planarization layer 460. The first electrode 481 may be electrically connected to the source electrode 413 via third contact holes CH3 provided in the planarization layer 460 and the passivation layer 450.

Although not shown in FIG. 4, in the active area AA, a plurality of first electrodes 481 may be disposed on the planarization layer 460 and may be spaced apart from each other.

The composition of the first electrode 481 may include a transparent conductive material.

The composition of the first electrode 481 may include a transparent conductive material comprised of a metal oxide of a metal, such as Zn, In, Ga, Sn, or Ti, or a combination selected from among metals, such as Zn, In, Ga, Sn, and Ti, and oxides thereof. For example, the composition of the first electrode 481 may include one of indium tin oxide (ITO), indium zinc oxide (IZO), indium gallium zinc oxide (IGZO), or combinations thereof, but embodiments are not limited thereto.

The bank 484 may be disposed on the first electrode 481 and the planarization layer 460. The bank 484 may be disposed to expose a portion of the top surface of the first electrode 481.

The bank 484 may be a component defining the emission area EA and the non-emission area NEA in the active area AA. Specifically, a portion of the active area AA in which the bank 484 is disposed may be the non-emission area NEA, and the remaining portion of the active area AA may be the emission area EA.

The organic layer 482 including at least one emissive layer may be disposed on the top surface of the first electrode 481 on which the bank 484 is not disposed.

The organic layer of the OLED 480 may be deposited using the first thin-film deposition mask assembly 100 illustrated in FIGS. 1 and 2.

The second electrode 483 may be disposed on the organic layer 482. The composition of the second electrode 483 may include a reflective material. For example, the composition of the second electrode 483 may include one selected from among Al, Au, Cu, Ti, W, Mo, or combinations thereof, but embodiments are not limited thereto.

Although the second electrode 483 may be disposed on the entire surface of the substrate 310 in the active area AA, embodiments are not limited thereto.

Since the composition of the first electrode 481 of the OLED 480 includes a transparent conductive material and the composition of the second electrode 483 includes a reflective material as described above, the OLED 480 having a bottom emission structure may be realized.

However, embodiments are not limited thereto, and any configuration in which the composition of at least one of the first electrode 481, the second electrode 483, or a combination thereof, includes a transparent conductive material may be used.

For example, the composition of the first electrode 481 may include a reflective metal and the composition of the second electrode 483 may include a transparent conductive material to realize the OLED 480 having a top emission structure. Alternatively, the composition of each of the first electrode 481 and the second electrode 483 may include a transparent conductive material to realize the OLED 480 having a double-sided emission structure.

An encapsulation member 490 may be disposed on the second electrode 483 of the OLED 480.

The encapsulation member 490 may include a first encapsulation layer 491 disposed on the second electrode 483, a second encapsulation layer 492 disposed on the first encapsulation layer 491, and a third encapsulation layer 493 disposed on the second encapsulation layer 492.

As described above, the organic layer 482 of the OLED 480, provided in the first emission area EA1, may be deposited using the first thin-film deposition mask assembly 100 as illustrated in FIGS. 1 and 2.

For example, as illustrated in FIG. 3, in a case in which a single pixel P includes first to third emission areas EA1 to EA3, the organic layer 482 disposed in each of the plurality of first emission areas EA1 emitting light having the same color may be fabricated using the first thin-film deposition mask assembly 100 according to an embodiment.

That is, a plurality of organic layers 482 disposed in the organic light-emitting display panel to emit blue light may be fabricated by a single process using the first thin-film deposition mask assembly 100 having the plurality of openings.

A single opening 112 provided in the first mask 110 may be used to deposit an organic layer provided in a single first emission area EA1. Here, the area of the single opening 112 may be greater than the area of an organic layer. This allows the organic layer to be disposed in the first emission area EA1 even in the case in which the substrate 310 and the first mask 110 are insignificantly misaligned.

However, embodiments are not limited thereto, and the other organic layer disposed in a plurality of second and third emission areas EA2 and EA3 may also be fabricated by the same process using the first thin-film deposition mask assembly 100 according to an embodiment.

Referring to FIG. 3, the first to third emission areas EA1 to EA3 may have different sizes. For example, the first emission area EA1 may be widest, while the third emission area EA3 may be narrowest. In this case, the lifespan of an OLED disposed in the first emission area EA1 may be shorter than that of an OLED disposed in each of the second and third emission areas EA2 and EA3, but embodiments are not limited thereto.

In a single pixel P, the second and third emission areas EA2 and EA3 may be disposed on one side of the first emission area EA1.

The first emission area EA1 may be configured such that the length thereof in the first direction is shorter than the length thereof in the second direction in the plan view. In addition, the length of the first emission area EA1 in the second direction may be longer than the length of each of the second and third emission areas EA2 and EA3 in the second direction. For example, a total of the length of the second emission area EA2 in the second direction and the length of the third emission area EA3 in the second direction may be shorter than the length of the first emission area EA1 in the second direction.

Accordingly, the width X between the first emission areas EA1 in the second direction may be narrower than either the width Y between the second emission areas EA2 or the width Z between the third emission areas EA3 in the second direction. Here, the second direction means one direction crossing the first direction on a plane. Specifically, the second direction may be a direction perpendicular to the first direction in a plane.

In general, the fine metal mask may be used to fabricate the organic layers disposed in the first emission areas EA1. The fine metal mask for fabricating the organic layers disposed in the first emission areas EA1 may include a plurality of slits or slots.

Since the length of the first emission area EA1 in the second direction is longer than the length of each of the second and third emission areas EA2 and EA3 in the second direction, and the width between the plurality of first emission areas EA1 in the second direction is narrower than either the width between the plurality of second emission areas EA2 or the width between the plurality of third emission areas EA3 in the second direction, it may be difficult to fabricate the organic layer disposed in a single first emission area EA1 through a single opening. Here, the second direction means one direction crossing the first direction on a plane. Specifically, the second direction may be a direction perpendicular to the first direction in a plane.

Thus, a typical fine metal mask may form a plurality of organic layers disposed in a single column through a single slit among the plurality of slits.

In other words, the first mask 110 according to an embodiment is used to form a single portion of the organic layer disposed in the first emission area EA1 through a single opening thereof, whereas the typical fine metal mask is used to fabricate organic layers disposed in a plurality of first emission areas EA1 through a single slit.

That is, the second directional length of a single opening of the first mask 110 according to an embodiment may be shorter than the length of a single slit of the typical fine metal mask.

The typical fine metal mask may include a rib disposed between a single slit and another adjustment slit, with the slits extending in the second direction. Thus, the area of the rib present between the slits may be reduced, thereby causing the mask to sag.

In particular, when a portion of the rib adjacent to the outermost slit of the mask is bent in the organic layer deposition device, a slit area adjacent to the outermost slit may not be properly masked during organic layer deposition, thereby causing a defect in the organic layer deposition. In this case, when the OLED is turned on, at least one of the emission areas located in a slit area adjacent to the outermost slit may generate an unintended unusual color, thereby causing a defect in the OLED.

In addition, the size of each of the slots of the mask must be greater than the size of each of the emission areas in order to form the organic layers in the emission areas without a defect, and the width of the rib at least partially (or entirely) surrounding the slots must be at least a predetermined size to prevent the rib from being bent.

However, since the size of the emission areas is smaller as the organic light-emitting display panel has higher definition, the size of the slots provided in the mask may also be reduced. In addition, in a case in which a small organic light-emitting display panel is required to have high definition, it may be difficult for the size of a single slot to be greater than the size of a single emission area or for the rib surrounding the slots to have a predetermined or greater size.

Specifically, a single slot is configured such that the slot is surrounded by the rib. In this case, the ability to form the slots by considering the margin of the slots (i.e., the size of the slots greater than the emission areas) while considering the margin of the rib between adjacent slots is limited. In particular, in a case in which high definition is required for the display panel and the small organic light-emitting display panel, there are technical limitations in controlling the size of the slots of the mask to obtain the margin of the slots for forming the organic layers in the emission areas without a defect.

In the first mask 110 of the first thin-film deposition mask assembly 100 according to an embodiment, as illustrated in FIG. 3, first openings 113 disposed in an odd column may be disposed to correspond to odd-numbered first emission areas EA1. In addition, second openings 114 disposed in an even column may be disposed to correspond to even-numbered first emission areas EA1.

The first and second openings 113 and 114 may be disposed in different columns (or rows), with a single second opening 114 being disposed between two first opening 113 in the first direction.

Here, the area of the plurality of first and second openings 113 and 114 may be greater than the size of the first emission areas EA1.

The organic layers of the OLEDs may be formed in some of the plurality of first emission areas EA1 provided in the organic light-emitting display panel using the first thin-film deposition mask assembly 100 disposed as above (step S1 in FIG. 3).

That is, since the first openings 113 disposed in an odd column are disposed to correspond to odd-numbered first emission areas EA1 among the first emission areas EA1 disposed in the first direction, the organic layers of the OLEDs may be fabricated in the first emission areas EA1 corresponding to the first openings 113.

In addition, since the second openings 114 disposed in an even column are disposed to correspond to even-numbered first emission areas EA1 among the first emission areas EA1 disposed in the first direction, the organic layers of the OLEDs may be fabricated in the first emission areas EA1 corresponding to the second openings 114.

The organic layers fabricated through the first and second openings 113 and 114 in step S1 may be organic layers generating light having the same color. For example, the organic layers fabricated through the first and second openings 113 and 114 may be organic layers generating blue light.

Afterwards, organic layers may be deposited in the plurality first emission areas EA1, in which no organic layers are deposited in step S1, by shifting the first thin-film deposition mask assembly 100. For example, the first thin-film deposition mask assembly 100 may be shifted by a distance K from one side of a first emission area EA1 disposed in a single column to one side of a first emission area EA1 disposed in another column.

After the first thin-film deposition mask assembly 100 has been shifted, first openings 113 disposed in an even column may be disposed to correspond to even-numbered first emission areas EA1. Here, the first openings 113 may be disposed to correspond to first emission areas EA1, in which no organic layers are deposited in step S1, in a single odd row. In addition, the second openings 114 disposed in an odd column may be disposed to correspond to odd-numbered first emission areas EA1 (step S2 in FIG. 3). Here, the second openings 114 may be disposed to correspond to first emission areas EA1, in which no organic layers are deposited in step S1, in a single even row.

That is, since the first openings 113 disposed in an even column are disposed to correspond to the even-numbered first emission areas EA1, the organic layers of the OLEDs may be fabricated in the first emission areas EA1 corresponding to the first openings 113.

In addition, since the second openings 114 disposed in an odd column are disposed to correspond to the odd-numbered first emission areas EA1, the organic layers of the OLEDs may be fabricated in the first emission areas EA1 corresponding to the second openings 114.

The organic layers fabricated through the first and second openings 113 and 114 in step S2 may be organic layers generating light having the same color. For example, the organic layers fabricated through the first and second openings 113 and 114 may be organic layers of the OLEDs generating blue light.

That is, in some embodiments, the entirety of the plurality of organic layers disposed in the first emission areas EA1 of the organic light-emitting display panel may be deposited by steps S1 and S2.

In addition, since the first thin-film deposition mask assembly 100 is shifted, there may be no first emission areas EA1 corresponding to the first openings 113 (or second openings 114) provided in the outermost portion of the first mask 110 in a shift direction of the first thin-film deposition mask assembly 100.

The material of the organic layer may not be supplied to areas corresponding to the first openings 313 provided in the outermost portion of the first mask 110, depending on the process. In addition, even in the case in which the material of the organic layer is not supplied to the areas corresponding to the first openings 313 provided in the outermost portion of the first mask 110, organic layers fabricated through the first openings 313 provided in the outermost portion of the first mask 110 may not be included in the emission areas of the organic light-emitting display panel, since no circuits able to drive an OLED are present in areas corresponding to the first openings 313.

In the first thin-film deposition mask assembly 100 according to an embodiment, the distance between adjacent first openings 113 disposed in a single column (or a single row) may be equal to or greater than the length of a longer side of a single first opening 113.

In addition, the distance between adjacent second openings 114 disposed in a single column (or a single row) may be equal to or greater than the length of a longer side of a single second opening 114.

For example, the first and third distances E and G in FIGS. 1 and 2 may be greater than the lengths of the longer sides of the first and second openings 113 and 114. In addition, the second and fourth distances F and H may be equal to or greater than the lengths of the longer sides of the first and second openings 113 and 114.

Since the first thin-film deposition mask assembly 100 according to embodiments has the above-described structure, even in the case in which a small organic light-emitting display panel is required to have high definition, each of the openings may be fabricated to be greater than a corresponding emission area or the rib surrounding the openings may be fabricated to have a predetermined or greater width.

Specifically, since the first mask 110 has the above-described structure, the number of the plurality of openings 112 of the first mask 110 may be smaller than the number of the emission areas of the organic light-emitting display panel. Accordingly, compared to the mask having the plurality of openings, the number of which is equal to the number of the emission areas, the margin of the rib 170 for a single opening 112 may be easily obtained. At the same time, the margin of the openings 112 for fabricating the organic layers in the emission areas without a defect may be obtained. Accordingly, a defect in organic layer deposition that would otherwise be caused by a defect in the mask, such as sagging, may be prevented.

In addition, the first mask having the first and second openings may improve the aperture ratio of each of the plurality of openings of the mask.

Although the method of fabricating the organic layers in the first emission areas EA1 of the organic light-emitting display panel using the single first thin-film deposition mask assembly 100 has been described hereinabove with reference to FIG. 3, embodiments are not limited thereto.

Figure 5:
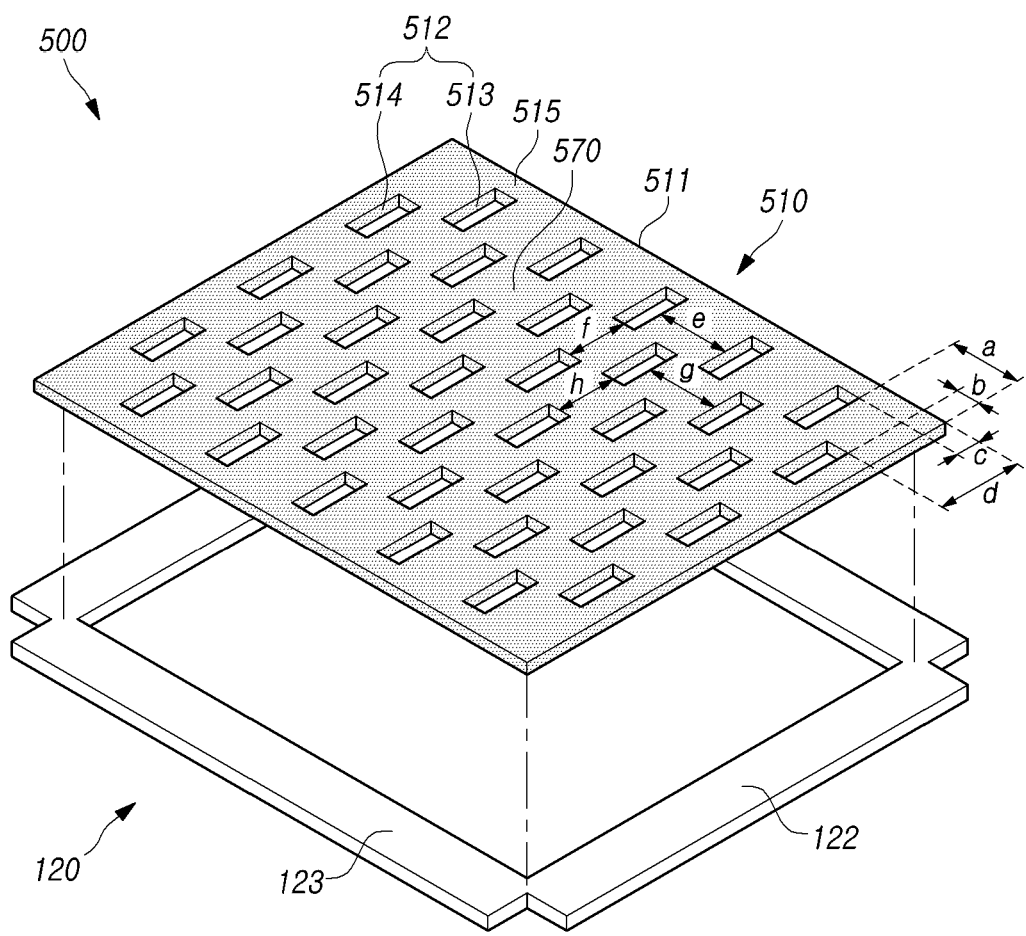
FIG. 5 is an exploded perspective view illustrating a thin-film deposition mask assembly according to another embodiment.
Figure 6:
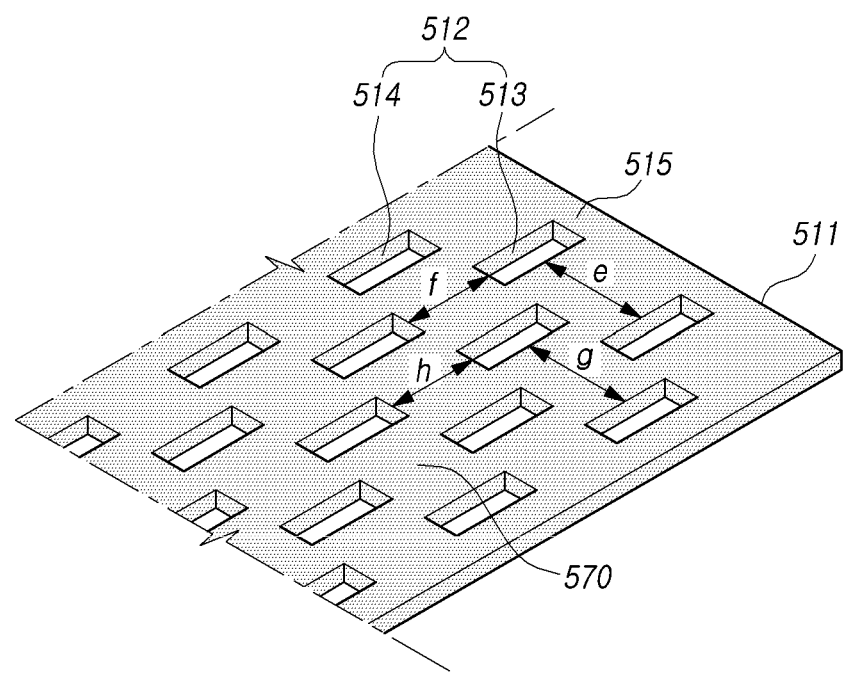
FIG. 6 is an enlarged view of a portion of the mask illustrated in FIG. 5.

FIG. 5 is an exploded perspective view illustrating a thin-film deposition mask assembly according to another embodiment, and FIG. 6 is an enlarged view of a portion of the mask illustrated in FIG. 5.

Referring to FIGS. 5 and 6, a second thin-film deposition mask assembly 500 according to another embodiment may include a second mask 510 and a frame 120.

The frame 120 illustrated in FIG. 5 may be the same as the frame 120 illustrated in FIG. 1.

The second mask 510 includes a second base member 511 and a plurality of openings 512 provided in the second base member 511.

A second rib 570 may be provided between the plurality of openings 512.

In addition, the second mask 510 may include a second rib support 515 surrounding an area in which the plurality of openings 512 and the second rib 570 are disposed. The second rib support 515 and the second rib 570 may be integrally provided.

The plurality of openings 512 of the second mask 510 may include a plurality of third openings 513 and a plurality of fourth openings 514. The plurality of third openings 513 may be disposed in odd columns (or odd rows), whereas the plurality of fourth openings 514 may be disposed in even columns (or even rows).

However, embodiments are not limited thereto, and the plurality of third openings 513 may be disposed in even columns, whereas the plurality of fourth openings 514 may be disposed in odd columns. In the following description, for the sake of brevity, an arrangement in which the third openings 513 are disposed in odd columns and the fourth openings 514 are disposed in even columns will mainly be described.

The second mask 510 according to embodiments may have a structure in which the plurality of third openings 513 are disposed in one or more odd columns and the plurality of fourth openings 514 are disposed in one or more even columns.

The plurality of third openings 513 and the plurality of fourth openings 514 may be used to fabricate organic layers disposed in different positions, and OLEDs including the organic layers deposited through the third and fourth openings 513 and 514 may emit light having the same color.

The plurality of third openings 513 disposed in respective odd columns may be spaced apart from each other in a second direction. Here, in third openings 513 disposed in a single column among the plurality of third openings 513, a third opening 513 may be spaced apart from an adjacent third opening 513 by a fifth distance e. That is, the third openings 513 disposed in the single column may be spaced apart from each other by the same fifth distance e.

In addition, the second rib 570 may be disposed between third openings 513 disposed in a single column among the plurality of third openings 513, in the first direction.

The plurality of third openings 513 disposed in odd columns may be spaced apart from each other in the second direction. Here, in third openings 513 disposed in a single row among the plurality of third openings 513, adjacent third openings 513 may be spaced apart from each other by a sixth distance f Third openings 513 disposed in an odd column and third openings 513 disposed in an adjacent odd column, among the plurality of third openings 513, may be equally spaced apart by the same sixth distance f.

The fifth distance e may indicate a minimum distance between adjacent third openings 513 disposed in a single column, among the plurality of third openings 513, in the first direction.

The sixth distance f may indicate a minimum distance between adjacent third openings 513 disposed in a single row among the plurality of third openings 513, in the second direction.

In addition, the second rib 570 may be disposed between adjacent odd columns of third openings 513 among the plurality of third openings 513.

The second rib 570 disposed between the third openings 513 may be provided integrally with the second rib support 515.

The plurality of fourth openings 514 in respective even columns may also be spaced apart from each other in the second direction. In fourth openings 514 disposed in a single column among the plurality of fourth openings 514, a fourth opening 514 may be spaced apart from an adjacent fourth opening 514 by a seventh distance g. That is, the fourth openings 514 disposed in the single column may be spaced apart from each other by the same seventh distance g.

In addition, the second rib 570 may be disposed in the second direction, between fourth openings 514 disposed in a single row among the plurality of fourth openings 514.

The plurality of fourth openings 514 disposed in respective even columns may be spaced apart from each other in the second direction. Here, among fourth openings 514 disposed in a single row among the plurality of fourth openings 514, adjacent fourth openings 514 may be spaced apart from each other by an eighth distance h. That is, fourth openings 514 disposed in an even column, among the plurality of fourth openings 514, may be equally spaced apart by the same eighth distance h.

The seventh distance g may indicate a minimum distance between adjacent fourth openings 514 disposed in a single column, among the plurality of fourth openings 514, in the first direction. The eighth distance h may indicate a minimum distance between adjacent fourth openings 514 disposed in a single row, among the plurality of fourth openings 514, in the second direction.

Here, the second distance E and the seventh distance g may be the same.

The sixth distance f and the eighth distance h may be the same. The fifth and seventh distances e and g may be greater than the sixth distance f and the eighth distance h.

The fifth distance e and the seventh distance g may range from 50 μm to 150 μm and the sixth distance f and the eighth distance h may range from 10 μm to 100 μm, but the distances according to embodiments are not limited thereto. For example, the fifth distance e and the seventh distance g may be 100 μm or more and less than 150 μm and the sixth distance f and the eighth distance h may be 10 μm or more and less than 100 μm.

In addition, the second rib 570 may be disposed between adjacent even rows of fourth opening 514 among the plurality of fourth openings 514.

The second rib 570 disposed between the third openings 513 and the second rib 570 disposed between the fourth opening 514 may be provided as an integral component. Due to the second rib 570 being disposed between the openings as described, deformation, such as sagging, in the second mask 510 having the plurality of openings 512 may be prevented.

Here, a third opening 513 disposed in an odd column (e.g., the mth odd column (where m is a natural number equal to or greater than 1)) may be disposed between two fourth openings 514 arranged in the first direction while being disposed in the (m+1)th column.

In addition, a third opening 513 disposed in an odd column (e.g., the (m+2)th odd column (where m is a natural number equal to or greater than 1)) may be disposed between a fourth opening 514 disposed in the (m+1)th column and a fourth opening 514 disposed in the (m+3)th column, the two fourth openings 514 being arranged in the second direction.

Here, a distance a in the first direction from outermost third openings 513 among the plurality of third openings 513 arranged in the first direction to the edge of the second mask 510 may be greater than a distance b in the first direction from outermost fourth openings 514 of the plurality of fourth openings 514 arranged in the first direction to the edge of the second mask 510.

In addition, a distance c in the second direction from outermost third openings 513 of the plurality of third openings 513 arranged in the second direction to the edge of the second mask 510 may be smaller than a distance d in the second direction from outermost fourth openings 514 of the plurality of fourth openings 514 arranged in the second direction to the edge of the second mask 510.

Each of the third and fourth openings 513 and 514 may have the shape of a rectangle, with the sides thereof in the second direction being longer than the sides thereof in the first direction. Since the plurality of third openings 513 and the plurality of fourth openings 514 are used to fabricate organic layers generating light having substantially the same color, the third and fourth openings 513 and 514 may have substantially the same shape. However, the shape of the third and fourth openings 513 and 514 is not limited to the rectangular shape illustrated in FIGS. 5 and 6, and may have a variety of shapes, such as a circular shape or a polygonal shape.

The second thin-film deposition mask assembly 500 according to the present embodiment may be used in a variety of thin-film deposition processes, and in particular, in a process of patterning organic layers of OLEDs.

Figure 7:
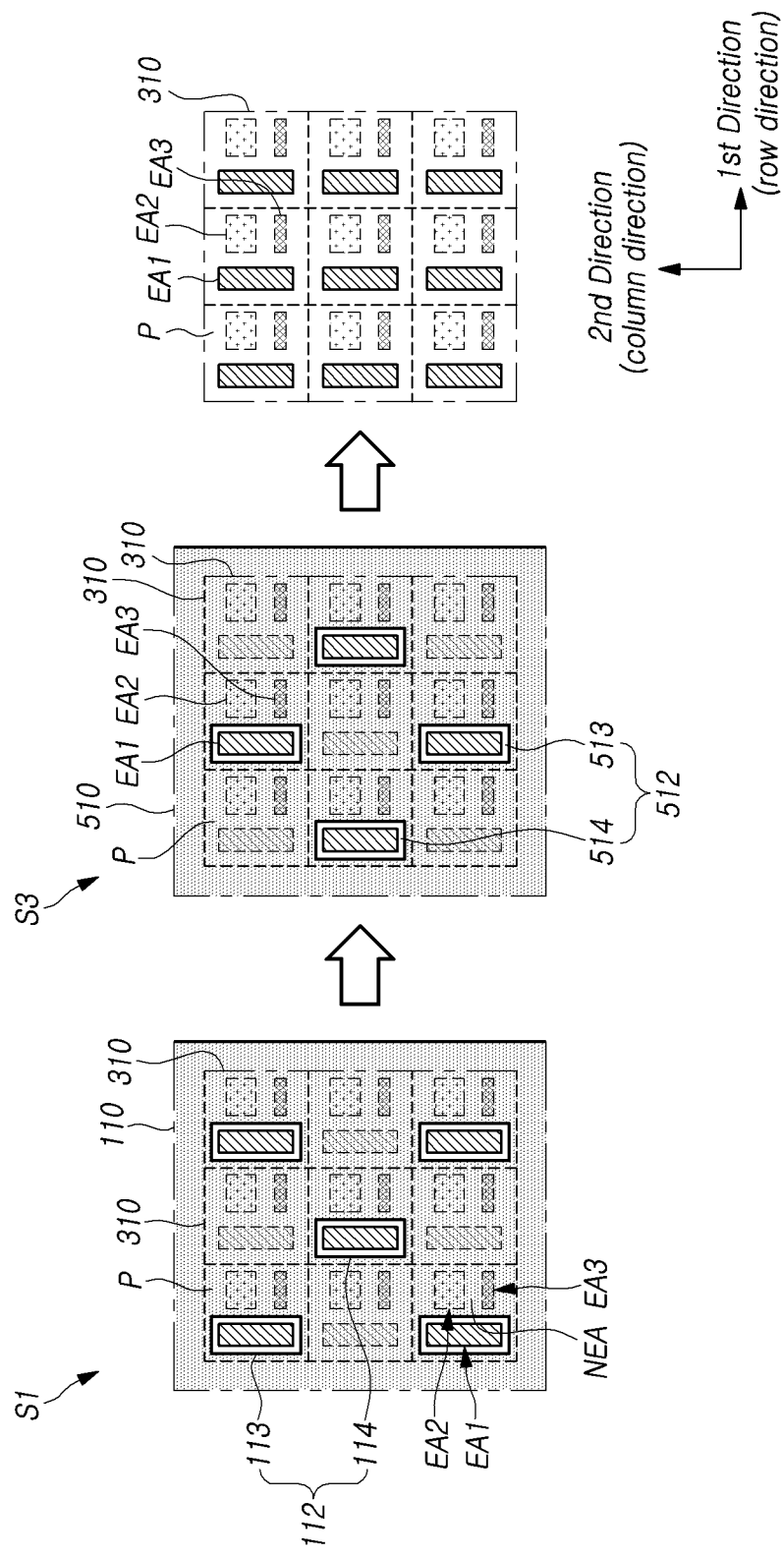
FIG. 7 is a schematic view illustrating some operations of a process of fabricating organic layers of OLEDs disposed in an organic light-emitting display panel.

FIG. 7 is a schematic view illustrating some operations of a process of fabricating organic layers of OLEDs disposed in an organic light-emitting display panel.

In the description of the present embodiment, descriptions of some features will be omitted when they are substantially the same as those of the above-described embodiment. Hereinafter, some operations of the process of fabricating organic layers of OLEDs disposed in an organic light-emitting display panel according to the present embodiment will be described with reference to FIG. 7.

Referring to FIG. 7, the organic layer 482 may be deposited in at least one emission area among a plurality of emissions areas EA1, EA2, and EA3 of the organic light-emitting display panel using the first and second thin-film deposition mask assemblies 100 and 500 illustrated in FIGS. 1, 2, 5, and 6.

Specifically, the organic layer of the OLED provided in the first emission areas EA1 of the organic light-emitting display panel may be deposited using the first and second thin-film deposition mask assemblies 100 and 500.

Step S1 illustrated in FIG. 7 may be the same as step S1 described above with reference to FIG. 3.

That is, the organic layers of the OLEDs may be fabricated in some of the plurality of first emission areas EA1 of the organic light-emitting display panel using the first thin-film deposition mask assembly 100.

First openings 113 disposed in odd columns, among the plurality of first openings 113, may be disposed to correspond to odd-numbered first emission areas EA1 among plurality of first emission areas EA1, so that organic layers of the OLEDs may be fabricated in the first emission areas EA1 corresponding to the first openings 113.

That is, since the first openings 113 disposed in an odd column are disposed to correspond to odd-numbered first emission areas EA1 among the first emission areas EA1 disposed in the first direction, the organic layers of the OLEDs may be fabricated in the first emission areas EA1 corresponding to the first openings 113.

In addition, since the second openings 114 disposed in an even column are disposed to correspond to even-numbered first emission areas EA1 among the first emission areas EA1 disposed in the first direction, the organic layers of the OLEDs may be fabricated in the first emission areas EA1 corresponding to the second openings 114.

The organic layers fabricated through the first and second openings 113 and 114 in step S1 may be organic layers generating light having the same color. For example, the organic layers fabricated through the first and second openings 113 and 114 may be organic layers generating blue light.

Afterwards, organic layers may be deposited in the plurality first emission areas EA1, in which no organic layers are deposited in step S1, using the second thin-film deposition mask assembly 500 illustrated in FIGS. 5 and 6 (step S3 in FIG. 7).

Specifically, the third openings 513 disposed in an odd column in the second thin-film deposition mask assembly 500 may be disposed to correspond to even-numbered first emission area EA1 among the first emission area EA1 disposed in the first direction, so that organic layers of the OLEDs may fabricated in the first emission areas EA1 corresponding to the third openings 513.

In addition, the fourth openings 514 disposed in an even column may be disposed to correspond to odd-numbered first emission area EA1 among the first emission areas EA1 disposed in the first direction, so that organic layers of the OLEDs may fabricated in the first emission areas EA1 corresponding to the fourth openings 514.

The organic layers fabricated through the third and fourth openings 513 and 514 of the second thin-film deposition mask assembly 500 in step S3 may generate light having the same color as light generated by the organic layers fabricated through the first and second openings 113 and 114 of the first thin-film deposition mask assembly 100. For example, the organic layers fabricated through the first to fourth openings 113, 114, 513, and 514 may be organic layers of OLEDs generating blue light.

That is, a plurality of organic layers disposed in the first emission areas EA1 of the organic light-emitting display panel may be deposited by step S1 using the first thin-film deposition mask assembly 100 and step S3 using the second thin-film deposition mask assembly 500.

Since the first and second masks 110 and 510 illustrated in FIG. 7 have the above-described structure, the number of the plurality of openings 112 and 512 provided in each of the first and second masks 110 and 510 may be smaller than the number of the emission areas of the organic light-emitting display panel. (Here, a total number of the openings of the first and second masks may be the same as the number of the emission areas of the organic light-emitting display panel.) Accordingly, compared to the mask having openings corresponding to the number of the emission areas, the margin of the rib 170 or 570 regarding a single opening 112 or 512 may be easily obtained. At the same time, the margin of the openings 112 or 512 for fabricating the organic layer in the emission areas without a defect may be obtained.

Figure 8:
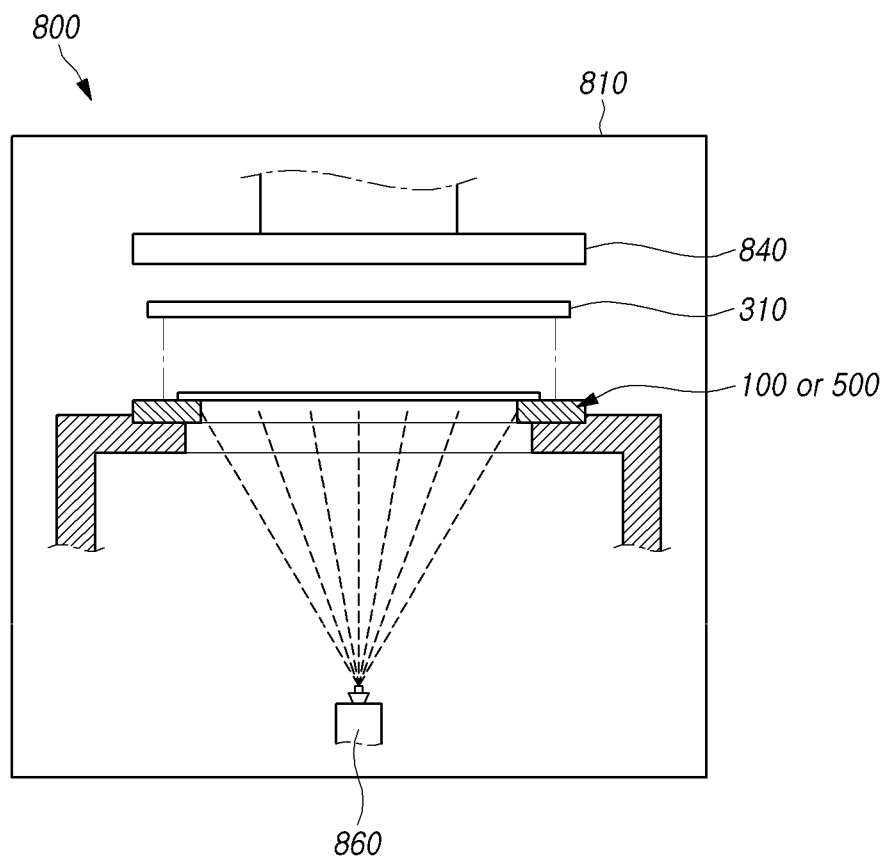
FIG. 8 is a schematic view illustrating a deposition device for performing a thin-film deposition process using the first and second thin-film deposition mask assemblies according to embodiments.

FIG. 8 is a schematic view illustrating a deposition device for performing a thin-film deposition process using the first and second thin-film deposition mask assemblies according to embodiments.

Referring to FIG. 8, a deposition device 800 according to an embodiment may use the first and second thin-film deposition mask assemblies 100 and 500 according to embodiments, described above with reference to FIGS. 1, 2, 5, and 6.

In order to deposit organic layers of OLEDs of the organic light-emitting display panel, the first or second thin-film deposition mask assembly 100 or 500 is disposed in the upper portion of an organic film deposition crucible 860 disposed in a vacuum chamber 810, and the substrate 310, on which a thin film is to be formed, is mounted on the first or second thin-film deposition mask assembly 100 or 500. In addition, a magnet array 840 for bring the first or second thin-film deposition mask assembly 100 or 500 into close contact with the top portion of the substrate 310 is driven, so that the first or second thin-film deposition mask assembly 100 or 500 comes into close contact with the substrate 310.

In this situation, the organic film deposition crucible 860 is operated, so that an organ layer material disposed in the organic film deposition crucible 860 may be vaporized, pass through the plurality of openings of the first or second thin-film deposition mask assembly 100 or 500, and be deposited on the substrate 310 in the pattern described above with reference to FIGS. 3 and 7.

As set forth above, according to embodiments, the thin-film deposition mask assembly including a plurality of first openings disposed in odd columns and a plurality of second openings disposed in even columns or a plurality of third openings disposed in odd columns and a plurality of fourth openings disposed in even columns is provided. The aperture ratio of each of the openings of the mask may be obtained. Organic layers disposed in the organic light-emitting display panel having fine emission areas may be deposited without a defect.

According to embodiments, the provision of the thin-film deposition mask assembly including a plurality of first openings disposed in odd columns and a plurality of second openings disposed in even columns or a plurality of third openings disposed in odd columns and a plurality of fourth openings disposed in even columns may prevent the mask from sagging during deposition of organic layers of OLEDs.

The above description and the accompanying drawings provide an example of the technical idea of the present disclosure for illustrative purposes only. Those having ordinary knowledge in the technical field, to which the present disclosure pertains, will appreciate that various modifications and changes in form, such as combination, separation, substitution, and change of a configuration, are possible without departing from the essential features of the present disclosure. Therefore, the embodiments disclosed in the present disclosure are intended to illustrate the scope of the technical idea of the present disclosure, and the scope of the present disclosure is not limited by the embodiment.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A thin-film deposition mask assembly, comprising:
a first mask comprising a first base member having a plurality of openings provided in the first base member, each of the opening being spaced apart from each other;
a first frame holding the first mask;
a plurality of first openings disposed in odd columns included in the plurality of openings of the first mask; and
a plurality of second openings disposed in even columns included in the plurality of openings of the first mask, the odd and even columns being arranged in a column direction;
wherein a single second opening is disposed in an nth even column, among the plurality of second openings, the second opening being disposed between two first openings arranged in a first direction corresponding to a row direction, the row direction being transverse to the column direction and disposed in at least one column of (n−1)th and (n+1)th columns, among the plurality of first openings, where n is a natural number equal to or greater than 2,
wherein a first distance between adjacent first openings of the plurality of first openings in the first direction is substantially the same as a second distance between adjacent second openings of the plurality of second openings in the first direction,
wherein a third distance between adjacent first openings of the plurality of first openings in a second direction overlapping the first direction is substantially the same as a fourth distance between adjacent second openings of the plurality of second openings in the second direction, and
wherein each of the first distance and the second distance is greater than each of the third distance and the fourth distance.

2. The thin-film deposition mask assembly according to claim 1, wherein the single second opening disposed in the nth even column is disposed between two first openings arranged in a second direction perpendicular to the first direction, among the plurality of second openings, one of the two first openings being disposed in the (n−1)th column, and the other of the two first openings being disposed in the (n+1)th column.

3. The thin-film deposition mask assembly according to claim 1, wherein a distance in the first direction from an outermost first opening among the plurality of first openings arranged in the first direction to an edge of the first mask is smaller than a distance in the first direction from an outermost second opening among the plurality of second openings arranged in the first direction to the edge of the first mask.

4. The thin-film deposition mask assembly according to claim 1, wherein a distance in the second direction from an outermost first opening among the plurality of first openings arranged in the second direction to an edge of the first mask is smaller than a distance in the second direction from an outermost second opening among the plurality of second openings arranged in the second direction to the edge of the first mask.

5. The thin-film deposition mask assembly according to claim 1, wherein the plurality of first openings and the plurality of second openings have corresponding shapes.

6. A thin-film deposition mask assembly comprising
a first mask comprising a first base member having a plurality of openings provided in the first base member, each of the opening being spaced apart from each other;
a first frame holding the first mask;
a plurality of first openings disposed in odd columns included in the plurality of openings of the first mask; and
a plurality of second openings disposed in even columns included in the plurality of openings of the first mask, the odd and even columns being arranged in a column direction;
wherein a single second opening disposed in an nth even column, among the plurality of second openings, the second opening being disposed between two first openings arranged in a first direction corresponding to a row direction, the row direction being transverse to the column direction and disposed in at least one column of (n−1)th and (n+1)th columns, among the plurality of first openings, where n is a natural number equal to or greater than 2,
wherein a first distance between adjacent first openings of the plurality of first openings in the first direction is substantially the same as a second distance between adjacent second openings of the plurality of second openings in the first direction,
wherein a third distance between adjacent first openings of the plurality of first openings in a second direction overlapping the first direction is substantially the same as a fourth distance between adjacent second openings of the plurality of second openings in the second direction, and
wherein each of the first distance and the second distance range from 50 μm to 150 μm and each of the third distance and the fourth distance range from 10 μm to 100 μm.

7. A thin-film deposition mask assembly, comprising:
a first mask comprising a first base member having a plurality of openings provided in the first base member, each of the opening being spaced apart from each other;
a first frame holding the first mask;
a plurality of first openings disposed in odd columns included in the plurality of openings of the first mask; and
a plurality of second openings disposed in even columns included in the plurality of openings of the first mask, the odd and even columns being arranged in a column direction;
wherein a single second opening disposed in an nth even column, among the plurality of second openings, the second opening being disposed between two first openings arranged in a first direction corresponding to a row direction, the row direction being transverse to the column direction and disposed in at least one column of (n−1)th and (n+1)th columns, among the plurality of first openings, where n is a natural number equal to or greater than 2,
a first distance between adjacent first openings of the plurality of first openings in the first direction is substantially the same as a second distance between adjacent second openings of the plurality of second openings in the first direction;
a third distance between adjacent first openings of the plurality of first openings in a second direction overlapping the first direction is substantially the same as a fourth distance between adjacent second openings of the plurality of second openings in the second direction; and
each of the first distance and the second distance is greater than the length of a longer side of each of the plurality of first openings and the plurality of second openings, and
each of the third distance and the fourth distance is equal to or greater than the length of the longer side of each of the plurality of first openings and the plurality of second openings.

8. A thin-film deposition mask assembly, comprising:
a mask comprising a base member having a plurality of openings provided in the base member, each of the opening being spaced apart from each other;
a frame holding the mask;
a plurality of first openings disposed in odd columns included the plurality of openings of the mask; and
a plurality of second openings disposed in even columns included the plurality of openings of the mask, the odd and even columns being arranged in a column direction;
wherein a single first opening disposed in an mth odd column, among the plurality of first openings, the first opening being disposed between two second openings arranged in a first direction corresponding to a row direction, the row direction being transverse to the column direction and disposed in an (m+1)th column, among the plurality of second openings, where m is a natural number equal to or greater than 1,
wherein a first distance between adjacent first openings of the plurality of first openings in the first direction is substantially the same as a second distance between adjacent second openings of the plurality of second openings in the first direction,
wherein a third distance between adjacent first openings of the plurality of first openings in a second direction overlapping the first direction is substantially the same as a fourth distance between adjacent second openings of the plurality of second openings in the second direction, and
wherein each of the first distance and the second distance is greater than each of the third distance and the fourth distance.

9. The thin-film deposition mask assembly according to claim 8,
wherein the single first opening disposed in the (m+2)th odd column is disposed between two second openings arranged in a second direction overlapping the first direction, among the plurality of second openings, one of the two second openings being disposed in the (m+1)th column, and the other of the two second openings being disposed in the (m+3)th column.

10. The thin-film deposition mask assembly according to claim 8,
wherein a distance in the first direction from an outermost first opening among the plurality of first openings arranged in the first direction to an edge of the mask is smaller than a distance in the first direction from an outermost second opening among the plurality of second openings arranged in the first direction to an edge of the mask.

11. The thin-film deposition mask assembly according to claim 8,
wherein a distance in the second direction from an outermost first opening among the plurality of first openings arranged in the second direction to an edge of the mask is greater than a distance in the second direction from an outermost second opening among the plurality of second openings arranged in the second direction to an edge of the mask.

12. The thin-film deposition mask assembly according to claim 8,
wherein the plurality of first openings and the plurality of second openings have corresponding shapes.

13. A thin-film deposition mask assembly comprising:
a mask comprising a base member having a plurality of openings provided in the base member, each of the opening being spaced apart from each other;
a frame holding the mask;
a plurality of first openings disposed in odd columns included the plurality of openings of the mask; and
a plurality of second openings disposed in even columns included the plurality of openings of the mask, the odd and even columns being arranged in a column direction;
wherein a single first opening disposed in an mth odd column, among the plurality of first openings, the first opening being disposed between two second openings arranged in a first direction corresponding to a row direction, the row direction being transverse to the column direction and disposed in an (m+1)th column, among the plurality of second openings, where m is a natural number equal to or greater than 1,
wherein a first distance between adjacent first openings of the plurality of first openings in the first direction is substantially the same as a second distance between adjacent second openings of the plurality of second openings in the first direction,
wherein a third distance between adjacent first openings of the plurality of first openings in a second direction overlapping the first direction is substantially the same as a fourth distance between adjacent second openings of the plurality of second openings in the second direction, and
wherein each of the first distance and the second distance range from 50 μm to 150 μm and each of the third distance and the fourth distance range from 10 μm to 100 μm.

14. A thin-film deposition mask assembly comprising:
a mask comprising a base member having a plurality of openings provided in the base member, each of the opening being spaced apart from each other;
a frame holding the mask;
a plurality of first openings disposed in odd columns included the plurality of openings of the mask; and
a plurality of second openings disposed in even columns included the plurality of openings of the mask, the odd and even columns being arranged in a column direction;
wherein a single first opening disposed in an mth odd column, among the plurality of first openings, the first opening being disposed between two second openings arranged in a first direction corresponding to a row direction, the row direction being transverse to the column direction and disposed in an (m+1)th column, among the plurality of second openings, where m is a natural number equal to or greater than 1, wherein a first distance between adjacent first openings of the plurality of first openings in the first direction is substantially the same as a second distance between adjacent second openings of the plurality of second openings in the first direction, wherein a third distance between adjacent first openings of the plurality of first openings in a second direction overlapping the first direction is substantially the same as a fourth distance between adjacent second openings of the plurality of second openings in the second direction, and wherein each of the first distance and the second distance is greater than the length of a longer side of each of the plurality of first openings and the plurality of second openings, and wherein each of the third distance and the fourth distance is equal to or greater than the length of the longer side of each of the plurality of first openings and the plurality of second openings.

15. A method of fabricating an organic light-emitting display panel including a substrate having a plurality of first emission areas, a plurality of second emission areas, and a plurality of third emission areas spaced apart from each other on the substrate, the method comprising:

disposing a thin-film deposition mask assembly over the substrate, the thin-film deposition mask assembly having a plurality of first openings disposed in odd columns of the thin-film deposition mask assembly disposed to correspond to odd-numbered first emission areas among the plurality of first emission areas arranged in a first direction and the plurality of second openings disposed in even columns of the thin-film deposition mask assembly disposed to correspond to even-numbered first emission areas among the plurality of first emission areas arranged in the first direction; and supplying an organic layer material to the substrate through the plurality of first and second openings of the thin-film deposition mask assembly.

16. The method according to claim 15, further comprising:

shifting the thin-film deposition mask assembly having the plurality of first openings and the plurality of second openings from one side of a first emission area disposed in a single column, among the plurality of first emission areas, to one side of a first emission area disposed in another column, among the plurality of first emission areas;

disposing the thin-film deposition mask assembly having the plurality of first openings disposed in the even columns of the thin-film deposition mask assembly are disposed to correspond to even-numbered first emission areas among the plurality of first emission areas arranged in the first direction and the plurality of second openings disposed in the odd columns of the thin-film deposition mask assembly are disposed to correspond to odd-numbered first emission areas among the plurality of first emission areas arranged in the first direction; and supplying the organic layer material to the surface of the thin-film deposition mask assembly having the plurality of first openings and the plurality of second openings.

17. The method according to claim 15, further comprising:

disposing the thin-film deposition mask assembly having the plurality of first openings disposed in the odd columns of the thin-film deposition mask assembly are disposed to correspond to even-numbered first emission areas among the plurality of first emission areas arranged in the first direction and the plurality of second openings disposed in the even columns of the thin-film deposition mask assembly are disposed to correspond to odd-numbered first emission areas among the plurality of first emission areas arranged in the first direction; and supplying the organic layer material to one surface of the thin-film deposition mask assembly having the plurality of first openings and the plurality of second openings.

18. A thin-film deposition mask assembly, comprising:

a first mask comprising a first base member;

a plurality of first openings provided in the first base member, each of the first opening being spaced apart from each other;

a plurality of second openings provided in the first base member, each of the second opening being spaced apart from each other;

wherein the plurality of first openings and the plurality of second openings are arranged to not overlap each other, wherein a first distance between adjacent first openings of the plurality of first openings in a first direction is substantially the same as a second distance between adjacent second openings of the plurality of second openings in the first direction, wherein a third distance between adjacent first openings of the plurality of first openings in a second direction transverse to the first direction is substantially the same as a fourth distance between adjacent second openings of the plurality of second openings in the second direction, wherein the first distance is greater than the third distance, and wherein the second distance is greater than the fourth distance.

* * * * *